US010501339B2

(12) United States Patent
Mottet

(10) Patent No.: US 10,501,339 B2
(45) Date of Patent: Dec. 10, 2019

(54) METHOD FOR CRYSTALLISING CLATHRATES HYDRATES, AND METHOD FOR PURIFYING AN AQUEOUS LIQUID USING THE CLATHRATES HYDRATES THUS CRYSTALLISED

(71) Applicant: BGH, Lacq (FR)

(72) Inventor: Bruno Mottet, Guidel (FR)

(73) Assignee: BGH, Lacq (FR)

( * ) Notice: Subject to any disclaimer, the term of this patent is extended or adjusted under 35 U.S.C. 154(b) by 0 days.

(21) Appl. No.: 15/765,374

(22) PCT Filed: Oct. 7, 2016

(86) PCT No.: PCT/EP2016/074044
§ 371 (c)(1),
(2) Date: Apr. 2, 2018

(87) PCT Pub. No.: WO2017/060456
PCT Pub. Date: Apr. 13, 2017

(65) Prior Publication Data
US 2018/0319673 A1 Nov. 8, 2018

(30) Foreign Application Priority Data
Oct. 9, 2015 (EP) .................................... 15306602

(51) Int. Cl.
*C02F 1/22* (2006.01)
*C30B 7/08* (2006.01)
(Continued)

(52) U.S. Cl.
CPC .............. *C02F 1/22* (2013.01); *B01D 9/0009* (2013.01); *C02F 1/001* (2013.01); *C02F 1/265* (2013.01);
(Continued)

(58) Field of Classification Search
CPC .. C02F 1/22; C02F 1/265; C02F 1/288; C02F 1/001; C30B 33/02; C30B 29/54; C30B 7/08; B01D 9/0009
See application file for complete search history.

(56) References Cited
U.S. PATENT DOCUMENTS

2003/0209492 A1    11/2003  Max
2007/0207082 A1    9/2007   Lee
(Continued)

OTHER PUBLICATIONS

Daisuke Katsuki et al., "Formation, growth and ageing of clathrate hydrate crystals in a porous medium" In Philosophical Magazine, Apr. 21, 2006, vol. 86, No. 2, pp. 1755-1756.
(Continued)

*Primary Examiner* — Chester T Barry
(74) *Attorney, Agent, or Firm* — Pearne & Gordon LLP

(57) ABSTRACT

A method for forming, or crystallising, clathrates hydrates of a host molecule in a liquid including water includes the following consecutive steps: cooling the liquid to a temperature no higher than the crystallisation temperature of the clathrates hydrates; and placing the cooled liquid in contact with host molecules that are capable of forming clathrates hydrates and are adsorbed on a solid support that has a large specific surface area and is made of a hydrophobic and apolar material, whereby the host molecules are desorbed from the solid support that has a large specific surface area and is made of a hydrophobic and apolar material, and react with the water of the liquid in order to provide a liquid containing clathrates hydrates and the solid support.

31 Claims, 3 Drawing Sheets

(51) Int. Cl.
| | |
|---|---|
| *C30B 29/54* | (2006.01) |
| *C02F 1/00* | (2006.01) |
| *B01D 9/00* | (2006.01) |
| *C02F 1/26* | (2006.01) |
| *C02F 1/28* | (2006.01) |
| *C30B 33/02* | (2006.01) |
| *C02F 1/52* | (2006.01) |
| *C02F 101/12* | (2006.01) |
| *C02F 101/30* | (2006.01) |
| *C02F 103/06* | (2006.01) |
| *C02F 103/08* | (2006.01) |
| *C02F 103/10* | (2006.01) |
| *C02F 103/16* | (2006.01) |
| *C02F 103/34* | (2006.01) |

(52) U.S. Cl.
CPC ............. *C02F 1/288* (2013.01); *C30B 7/08* (2013.01); *C30B 29/54* (2013.01); *C30B 33/02* (2013.01); *B01D 2009/009* (2013.01); *C02F 1/26* (2013.01); *C02F 2001/5218* (2013.01); *C02F 2101/12* (2013.01); *C02F 2101/30* (2013.01); *C02F 2103/06* (2013.01); *C02F 2103/08* (2013.01); *C02F 2103/10* (2013.01); *C02F 2103/16* (2013.01); *C02F 2103/343* (2013.01); *C02F 2209/02* (2013.01)

(56) References Cited

U.S. PATENT DOCUMENTS

| | | | |
|---|---|---|---|
| 2015/0203972 A1* | 7/2015 | Rose-Petruck | C25B 3/04 205/440 |
| 2017/0044024 A1 | 2/2017 | Mottet | |
| 2017/0157643 A1* | 6/2017 | Park | G03F 7/0002 |

OTHER PUBLICATIONS

Search Report for European Application No. 15 30 6602 dated Mar. 18, 2016.

International Search Report for PCT/EP2016/074044 dated Nov. 18, 2016.

U.S. Appl. No. 15/563,916 entitled "Method for Water Purification by Direct Osmosis and Crystallisation of Clathrates Hydrates", filed Oct. 2, 2017.

* cited by examiner

METHOD FOR CRYSTALLISING CLATHRATES HYDRATES, AND METHOD FOR PURIFYING AN AQUEOUS LIQUID USING THE CLATHRATES HYDRATES THUS CRYSTALLISED

This is a National Stage application of PCT international application PCT/EP2016/074044, filed on Oct. 7, 2016 which claims the priority of French Patent Application No. 15306602.2, filed Oct. 9, 2015, both of which are incorporated herein by reference in their entirety.

TECHNICAL FIELD

The invention relates to a method for crystallising clathrates hydrates.

More precisely, the invention relates to a method for crystallising clathrates hydrates of a host molecule in an aqueous liquid, that is to say, a liquid comprising water, such as an aqueous solution.

The invention further relates to a method such as a method for purifying an aqueous liquid using the clathrates hydrates thus crystallised.

More precisely, the invention further relates to a method for purifying an aqueous liquid, wherein clathrates hydrates of a host molecule are crystallised in the aqueous liquid by the method according to the invention; the clathrates hydrates are separated from the liquid; and finally, the separated clathrates hydrates are dissociated in order to obtain pure water and the host molecule.

Purification of water generally means any operation in which water containing impurities at an initial concentration is treated in such a way that after this operation, the final concentration of impurities is less than the initial concentration.

Impurity means any element, molecule, ion, or other, different than the elements constituting pure water, namely $H_2O$, $OH^-$, and $H^+$.

This purification method may be, for example, a method for desalinisation for example of seawater, a method for treating water from industrial productions, or a method for treating landfill leachates.

The technical field of the invention can thus be defined in general as that of the formation, crystallisation of clathrates hydrates in particular for the purposes of purifying an aqueous liquid.

PRIOR ART

First of all, it is recalled that the word "clathrate" comes from the Greek "Klathron" which means closing. Clathrates are a family of crystalline structures in the form of a cage capable of trapping a molecule called host molecule in their core.

In the case of hydrates, the water molecules organise themselves in the form of a cage solely maintained by weak bonds of the hydrogen bond type and trap a host molecule in their core.

The most known clathrates are the gas hydrates that comprise a host molecule that is gaseous such as methane, ethane, butane, propane, hydrogen sulphide, or carbon dioxide. These gas hydrates are formed in very specific pressure and temperature conditions (namely generally at pressures of several tens of atmospheres, and at temperatures slightly above 0° C.) according to the nature of the gas(es). Certain hydrocarbons, such as cyclopentane clathrate, crystallise, however, under atmospheric pressure up to 7° C.

By their "anionic" structural nature, clathrates hydrates have the peculiarity of crystallising very selectively, that is to say, without including impurities within their crystalline structure. Their crystallisation is thus quasi-independent of the nature and the concentration of the various impurities present in the solution, only the crystallisation temperature of the clathrate hydrate is capable of varying depending on the nature and the concentration of impurities.

In a solution rich in impurities and containing host molecules capable of forming a clathrate, the crystallisation of the hydrate by pumping water molecules contributes to concentrating impurities in the solution. In other words, the crystallisation of the clathrate has the effect of extracting the water molecules from the solution as long as the host molecules are available.

Once separated from the liquid phase, the melting of the hydrate allows extremely pure water to be obtained at temperatures between 0° C. and 10° C. if the host molecule can be easily separated in the form of a gas, or by sedimentation for the insoluble hydrocarbons such as cyclopentane.

Under controlled conditions, the crystallisation of clathrates hydrates, in particular of cyclopentane, is relatively easy.

FIG. 1 shows an example of a curve that gives the temperature T (in ° C.) of an aqueous liquid, such as an aqueous solution, during the crystallisation of a clathrate hydrate of a host molecule, such as cyclopentane in this aqueous liquid as a function of time t (in minutes), this crystallisation being carried out by a conventional method not according to the invention.

This curve allows both the energy consumption during the crystallisation of the clathrates hydrates and the kinetics of this crystallisation to be evaluated.

With regard to the energy consumption, this curve shows that two energy intakes, supplies, are necessary during the crystallisation.

First of all, during a first step, the liquid is cooled from the ambient temperature, for example 25° C., to a temperature $T_1$ lower than the crystallisation temperature of the hydrate, and the host molecules are then placed in contact with the liquid at the time $t_0$, for example the host molecules are then introduced into the liquid at the time $t_0$.

In FIG. 1, for example, the time $t_0$ is approximately 60 minutes, and the temperature $T_1$ is maintained until the first crystals of hydrate appear, in other words until nucleation of the hydrate occurs, indicated by a phase change with the appearance of a solid phase of hydrate. This nucleation occurs at the time $t_1$. In FIG. 1, for example, the time $t_1$ is approximately 120 minutes.

There may be a latency duration between the time $t_0$ and the time $t_1$.

In FIG. 1, for example, this latency duration is approximately 50 to 60 minutes between $t_0$ and $t_1$.

The duration $t_1$-$t_0$ is very variable and random, the nucleation is called "stochastic".

The temperature $T_1$ is lower than the crystallisation temperature of the hydrate in order to be able to initiate the crystallisation, it is thus dependent on both the hydrate and the host molecule. This temperature $T_1$ is less than 7° C. in the case in which the host molecule is cyclopentane.

In FIG. 1 for example, the temperature $T_1$ is close to 1° C., and it is thus much lower than 7° C.

Then, during a second step that thus starts at the time $t_1$, the crystalline structure of the hydrate is constructed.

This is an exothermic reaction with a ΔH of approximately 280 KJ/Kg of hydrate if the host molecule is cyclopentane, i.e. approximately 350 KJ/Kg of crystallised water in the form of a hydrate.

Thus, the curve of FIG. 1 has an exothermic peak caused by the formation of the hydrate, with a phase change, leading to an increase in the temperature of the liquid up to a temperature $T_2$.

This exothermic peak, with an increase in temperature, must be compensated for by additional cooling, which involves energy consumption.

Because of this cooling, the temperature of the liquid decreases until it comes back to the temperature $T_1$ and that the exothermic peak disappears at the time $t_2$.

The first and second step constitute the method, strictly speaking, for crystallisation, formation of the hydrates.

These steps, when they are integrated into a purification method are generally carried out in a reactor/decanter, and are generally followed, as already mentioned above, by a step of separating the clathrates hydrates from the liquid, then by a step of dissociation of the clathrates hydrates, generally by melting.

Thus, on the curve of FIG. 1, after the exothermic peak and the time $t_2$, since the reaction of formation of the clathrates hydrates is completed, the cooling is stopped, and the hydrate melts.

The energy consumption during the first cooling step, until $t_1$, is generally approximately 20% of the total energy consumption during the continuous method for forming the hydrates, since approximately 4 KJ/Kg of solution are needed to cool the solution by one degree Celsius, i.e. 96 KJ/Kg to bring the solution from 25° C. to 1° C.; whereas the energy consumption during the second cooling step, between $t_1$ and $t_2$, is generally approximately 80% of the total energy consumption during the method for forming the hydrates, since the exothermy of approximately 350 KJ per Kg of water corresponding to the crystallisation of the hydrate must be compensated for.

The total, overall, energy consumption of the method for forming the hydrates from a solution at 25° C. is high, it can reach for example, in the presence of NaCl and in eutectic conditions that involve cooling to a temperature of approximately −15° C., for example 45 KWh/m$^3$ of water for the first cooling step, and for example 97 KWh/m$^3$ of water during the second cooling step.

There is therefore a need for a method for forming, crystallising hydrates having lower energy consumption.

With regard to the kinetics of a conventional crystallisation method, it is observed on the curve of FIG. 1 that they are relatively slow. For example, the time $t_1$ is approximately 120 minutes, while the time between $t_2$ and $t_1$, that is to say, the duration of the exothermic peak is generally 80 minutes.

Moreover, it is known that the hydrates form at the interface between the host molecule and water and that the kinetics of crystallisation, formation, of the hydrates, that is to say, the kinetics of the reaction between water and the host molecule are conditioned by the contact surface, area between the host molecule and water. The greater the contact surface, area, the better the kinetics.

In the case in which the host molecule is a molecule insoluble in water such as cyclopentane, the contact surface, area is very low, the kinetics are therefore extremely slow, and a liquid chemical dispersant such as a compound of the TWEEN® or SPAN® type must then be used, or a very dynamic mechanical stirring must be implemented, in order to disperse the insoluble host molecule in water in the form of fine droplets forming an emulsion, and thus increase the contact surface, area between water and the host molecule.

The kinetics are thus improved, and more hydrate is easily produced, but the dispersant remains in the water and the method thus has the disadvantage of requiring a subsequent step of separation, elimination, removal of the liquid dispersant for example by absorption.

Finally, the yield of the crystallisation method is still insufficient.

There is therefore a need for a method for forming, crystallising, hydrates in which the kinetics, are improved without it being necessary, however, to use liquid dispersants.

There is also a need for a method for forming, crystallising hydrates, the yield of which is improved.

If attention is now shifted to the curve T(t) after the time $t_2$ (FIG. 3), the hydrates are then generally dissociated by melting. Thus, after $t_2$, since the cooling has stopped, an increase in the temperature of the liquid comprising water and hydrates is observed, and then the hydrates melt and are dissociated, and the temperature remains constant for a duration comprised between the time $t_3$ corresponding to the beginning of the melting, and $t_4$. The curve T(t) thus has, between the times $t_3$ and $t_4$, a temperature plateau or melting plateau that corresponds to a melting endotherm. After the end of this plateau, at the time $t_4$, the hydrates are completely dissociated, the liquid comprises water and host molecules such as cyclopentane, and the temperature of the liquid increases.

It is understood that the melting endotherm generates frigories, the recovery of which with a heat pump in order to reinject them in the upstream step of crystallisation of a continuous method implementing a step of crystallisation of the hydrates and a step of melting the hydrates is of interest. The heat pump improves the energy consumption of the method but significantly increases its material cost. The goal of the present invention is to provide a method for forming, crystallising hydrates that satisfies, inter alia, the needs listed above, that does not have the drawbacks, defects, limitations and disadvantages of the methods for forming, crystallising hydrates of the prior art and that solves the problems of the methods for forming, crystallising hydrates of the prior art.

The goal of the present invention is also to provide a method, for purification of an aqueous liquid, that does not have the drawbacks, defects, limitations and disadvantages of such methods of the prior art and that solves the problems of such methods of the prior art in particular with regard to the step of dissociation, melting, of the hydrates.

DISCLOSURE OF THE INVENTION

This goal, and others, are reached, according to the invention, by a method for forming, crystallising, clathrates hydrates of a host molecule in a liquid comprising water, characterised in that the following successive steps are carried out:

the liquid is cooled to a temperature less than or equal to the crystallisation temperature of the clathrates hydrates;

the cooled liquid is put in contact with host molecules capable of forming clathrates hydrates, adsorbed onto a solid support having a high specific surface area and made of an apolar and hydrophobic material, whereby the host molecules are desorbed from the solid support having a high specific surface area and made of an apolar and hydrophobic material and react with the water of the liquid to give a liquid containing clathrates hydrates and the solid support.

In other words, the host molecules are separated (are desorbed) from the solid support in order to form clathrates hydrates, while, separately, the solid support free of hydrates remains in the liquid.

High specific surface area generally means a specific surface area from 100 to 2000 m²/g.

Liquid comprising water generally means a liquid comprising more than 50% water by volume, preferably more than 80% water by volume.

In the present document, for reasons of simplification, the term "hydrate" is often used instead of "clathrate hydrate".

The method according to the invention for forming (crystallising) clathrates hydrates of a host molecule in a liquid comprising water, is fundamentally defined by the feature according to which the already-cooled liquid is put in contact, with host molecules capable of forming clathrates hydrates, these host molecules being, according to the invention, previously (that is to say, before they are put in contact with the cooled liquid), adsorbed onto a solid support having a high specific surface area and made of an apolar and hydrophobic material.

This essential feature of the method according to the invention has never been described or suggested in the prior art.

It can be said that according to the invention, the host molecule, in particular liquid and insoluble in water, such as cyclopentane, instead of being dispersed in the form of fine droplets dispersed in the aqueous liquid, is, in a surprising and advantageous manner, adsorbed onto a catalytic support that is very reactive because of its high specific surface area.

In other words, in the method according to the invention, the host molecule, in particular liquid and insoluble in water, such as cyclopentane, is spread out on a catalytic support having a high specific surface area, for example on activated carbon.

According to the invention, the catalytic substrate having a high specific surface area is made of a specific material, namely an apolar and hydrophobic material, for example coal or carbon, in order to prevent the adsorption of the water onto this solid support, and in order for only the host molecule, in particular liquid and insoluble in water, such as cyclopentane adsorb onto the solid support.

In the method according to the invention, because of the implementation of a solid support having a high specific surface area and made of an apolar and hydrophobic material, the host molecule, in particular liquid and insoluble in water, such as cyclopentane is on the support in the molecular state and no longer in the form of fine droplets. Because of the solid support used according to the invention, there are no longer such fine droplets or microdroplets in the liquid, and all the cyclopentane is "reactive" since it is adsorbed onto the surface of the solid support in particular made of activated carbon. Moreover, there is no longer the phenomenon of encapsulation of the droplets of cyclopentane under the effect of the crystallisation of the hydrate on the surface of the latter.

The contact surface between the host molecule, in particular liquid and insoluble in water, such as cyclopentane and water, in other words, the interface between the host molecule and water is therefore, according to the invention, considerably increased, and almost every host molecule is available to form clathrates with water by desorption from the support.

As already mentioned above, it is known that the hydrates are formed at the interface between the host molecule and water and that the kinetics of crystallisation, formation of the hydrates, that is to say, the kinetics of the reaction between water and the host molecule are, inter alia, conditioned by the contact surface between the host molecule and water. Therefore, in the method according to the invention, the kinetics of formation of the hydrates are considerably increased.

In the method according to the invention, the host molecule such as cyclopentane, is never free, it is always captive, since it is either integrated into the hydrate or adsorbed onto the support for example made of activated carbon.

Because of the fundamental feature of the method according to the invention, disclosed above (namely the feature according to which the cooled liquid is put in contact with host molecules capable of forming clathrates hydrates, these host molecules being, according to the invention, adsorbed onto a solid support having a high specific surface area and made of an apolar and hydrophobic material), the disadvantages of the method for forming (crystallising) clathrates hydrates of the prior art are overcome and the problems of the methods for forming (crystallising) clathrates hydrates of the prior art are solved.

The method according to the invention allows the problems of the methods of the prior art, in particular with regard to the energy consumption, kinetics, and yield, to be overcome.

Thus, with regard to the energy consumption that is the item involving the highest costs, the method according to the invention allows the energy consumption to be reduced significantly and thus the corresponding costs to be reduced significantly.

FIG. 2 shows a curve that gives the temperature T (in ° C.) of an aqueous liquid, such as an aqueous solution during the crystallisation of a clathrate hydrate of a host molecule, such as cyclopentane in this aqueous liquid as a function of time t (in minutes), this crystallisation being carried out by the method according to the invention.

If this curve is compared to that of FIG. 1, which is that corresponding to a conventional method, it is observed, in a totally surprising manner, that the exothermic peak of the curve of FIG. 1 between the times $t_1$ and $t_2$ has completely disappeared.

As mentioned above, the energy consumption during the second cooling step, between $t_1$ and $t_2$, in order to compensate for the exothermic peak, is generally approximately 80% of the total energy consumption during the method for forming the hydrates. With the method according to the invention, it is no longer necessary to consume energy to compensate for this exothermic peak, and a considerable gain of approximately 90% to 95% is made on the energy consumption, during this second cooling step, and the gain on the overall energy consumption of the method is approximately 72% to 76%.

The total, overall, energy consumption of the method for forming hydrates according to the invention is thus for example only 10 KWh/m³, whereas it was 45 KWh/m³ for the methods of the prior art implementing of course the same aqueous liquid and the same host molecule, and a heat pump device. The advantages that result from this are in particular a smaller sizing of the facility and the elimination of a heat pump.

Without desiring to be bound by any theory, the disappearance of the exothermic peak may be caused by the fact that the method according to the invention simultaneously involves, on the one hand, a reaction of desorption of the host molecule, such as cyclopentane, from the solid support, which is an endothermic reaction, and a reaction of crystallisation of the hydrate which is an exothermic reaction.

The energy given off by the exothermic reaction is therefore almost totally or even totally absorbed by the endothermic reaction, and the exothermic peak is almost in particular even totally eliminated.

With regard to the kinetics, as already mentioned above, the kinetics of formation of the hydrates are considerably increased. The total crystallisation of the hydrates is in a completely surprising manner, extremely fast.

In the methods of the prior art, this crystallisation takes place between the times $t_1$ and $t_2$, and its duration is that of the exothermic peak.

In the method according to the invention, the exothermic peak is eliminated and the total crystallisation of the hydrates takes place immediately or almost immediately after $t_1$ and the duration of the crystallisation is extremely short.

For example, the total crystallisation of the hydrates may, in the method, according to the invention take less than 2 minutes, whereas in the methods of the prior art, the time for obtaining total crystallisation of the hydrates between the times $t_1$ and $t_2$ is for example 80 minutes (see FIG. 2).

The wide availability of the host molecule in the method according to the invention, leads to a considerable gain in the yield of transformation of the host molecule, for example with respect to the methods in which the host molecule is in the form of very fine droplets.

Another advantage of the method according to the invention, which is particularly highlighted in the case in which the host molecule is a molecule insoluble in water, such as cyclopentane, is that the method according to the invention does not use a liquid chemical dispersant such as a compound of the TWEEN® or SPAN® type, and that a very dynamic mechanical stirring is not implemented to disperse the insoluble host molecule in the water. Consequently, with respect to the methods that implement such liquid chemical dispersants, the method according to the invention has the advantage of not requiring a subsequent step of separation, elimination, removal of the liquid dispersant, for example by absorption.

The method according to the invention may further be carried out successfully in a very wide temperature range, both at the eutectic and outside of the eutectic.

There is no limit on the manner in which the cooled liquid may be put in contact with the host molecules adsorbed onto the solid support.

Thus, the cooled liquid may be put in contact with the host molecules adsorbed onto the solid support, by adding the cooled liquid to the host molecules adsorbed onto the solid support, in particular by introducing the cooled liquid into the host molecules adsorbed onto the solid support, and/or the cooled liquid may be put in contact with the host molecules adsorbed onto the solid support, by adding the host molecules adsorbed onto the solid support to the cooled liquid, in particular by introducing the host molecules adsorbed onto the solid support into the cooled liquid.

For example, the host molecules adsorbed onto the solid support may be added to the cooled liquid, in particular introduced into the cooled liquid, by adding, introducing, sending, the host molecules adsorbed onto the solid support into a tank or reactor in which the cooled liquid is already present; or the cooled liquid may be added to the host molecules adsorbed onto the solid support, in particular introduced into the host molecules adsorbed onto the solid support, by adding, introducing, sending, the cooled liquid into a tank or reactor in which the host molecules adsorbed onto the solid support are already present; or the cooled liquid and the host molecules adsorbed onto the solid support, may be sent, introduced simultaneously into a tank or reactor.

Advantageously, the method according to the invention may be carried out continuously.

Advantageously, the host molecules and the solid support having a high specific surface area may be put in contact (outside of the liquid), whereby the host molecules are adsorbed onto the solid support having a high specific surface area, and then the solid support having a high specific surface area onto which the host molecules are adsorbed is put in contact with the cooled liquid; for example, the solid support having a high specific surface area onto which the host molecules are adsorbed is introduced into the cooled liquid.

Advantageously, the solid support may be in the form of discrete particles, such as beads (balls), fibres, or tubes.

The beads, for example the beads made of activated carbon, may have a diameter from 0.2 to 1.5 mm.

A solid support in the form of beads is particularly advantageous, since such beads are not subject to attrition, are hardly subject to wear, and may be recovered at the end of the method and reused in a quasi-infinite manner.

Beads made of activated carbon that proved to be particularly advantageous for implementing the method according to the invention are the beads G BAC G70R from Kureha®, which undergo very little attrition.

The solid support may also be in the form of a fabric of fibres or of a nonwoven fabric of fibres.

In general, the solid support may be made of a material chosen from all the materials that allow the adsorption and the desorption of the host molecule.

In general, the adsorbent solid support is made from a material chosen from the materials capable of adsorbing the host molecule with an adsorption energy lower than the energy of crystallisation of the clathrates hydrates.

Advantageously, the adsorbent solid support may be made of a material chosen from activated carbon; the oxides of metals such as the aluminas; the oxides of metalloids such as the silicas, in particular the mesoporous silicas; the zeolites; and the organic polymers, etc.

The host molecule is generally chosen from the molecules that meet the following two criteria:

(1) it must be capable of adsorbing onto the solid support, for example made of activated carbon;

(2) it must form hydrates.

In general, it may also be considered that the support and the host molecule are chosen in such a way that the bonding energy between the host molecule (for example Cyclopentane) and the support (for example made of activated carbon) is not very high. Indeed, if this bonding energy is too high, then the host molecule is not available for forming the hydrate.

The host molecule may in particular be chosen from the linear or branched hydrocarbons comprising from 1 to 6 carbon atoms such as methane, ethane, propanes, and butanes; the halogenated hydrocarbons; the cyclic hydrocarbons comprising from 3 to 10 carbon atoms; $CO_2$; oxygen; nitrogen; $H_2S$; the noble gases such as argon, krypton and xenon; tetrahydrofuran; ethylene oxide; sulphur hexafluoride; tetra-n-butylammonium bromide (TBAB); and $N_2O$.

The gaseous host molecules generally require high pressures, namely from 0.5 MegaPascals to 5 MegaPascals.

Advantageously, the host molecule is immiscible with water, or insoluble in water.

Advantageously, the host molecule is chosen from the host molecules that allow crystallising of clathrates hydrates at atmospheric pressure and at temperatures greater than that of the crystallisation of ice (water ice).

Advantageously, the host molecule is chosen from the molecules that form a clathrate hydrate having a specific gravity lower than the specific gravity of the aqueous solution, for example lower than 1.3, preferably lower than 1.0.

A preferred host molecule is cyclopentane or cyclohexane.

Indeed, the clathrate hydrate of cyclopentane associates 17 molecules of water per molecule of cyclopentane in the structure $[C_5H_{10}].17H_2O$.

Cyclopentane allows clathrates hydrates to be crystallised at atmospheric pressure at temperatures greater than the temperature of crystallisation of ice, since the clathrate hydrate of cyclopentane has a crystallisation temperature (or equilibrium temperature) of approximately 7° C. in the presence of pure water.

Cyclopentane is in the liquid state under normal conditions. It is immiscible with water and allows clathrates hydrates having a specific gravity lower than that of water to be crystallised, since the clathrate hydrate of cyclopentane has a specific gravity of 0.95.

In general, the liquid comprising water may comprise water and at least one impurity, in particular the liquid may consist of water (pure) and of at least one impurity.

The liquid may be a solution containing dissolved impurities, or a suspension containing dispersed impurities, suspended impurities, or a solution containing dissolved impurities and impurities in suspension in said solution.

Advantageously, the liquid is an aqueous solution.

Aqueous solution generally means a solution in which the solvent comprises at least 50% water by volume, especially, consists of water.

There is no limit on the impurity or impurities that the first liquid contains and the method according to the invention ensures the purification of liquids regardless of the impurities that they contain.

Impurity, as already specified, means any element, molecule, ion, or other, different than the elements constituting pure water, namely $H_2O$, $OH^-$, and $H^+$.

The impurity may in particular be chosen from the mineral salts such as NaCl, the organic salts, the organic compounds soluble in water, and their mixtures.

The method according to the invention also ensures the purification of liquids that have broad ranges of concentrations of impurities.

The liquid may in particular have a concentration of impurities from 1 mg/L to 500 g/L, preferably from 100 mg/L to 250 g/L.

Consequently, there is also no limit on the nature of the liquid that may be used in the method according to the invention and that may be treated by the purification method according to the invention described below.

The liquid may thus in particular be chosen from seawater; brackish waters; public landfills leachates; waters from oil production; waters from extraction of shale gas by the hydraulic fracturing technique; liquids from the agri-food industry such as fruit juices or coffee; liquids from the pharmaceutical industry; liquids from the chemical industry; mining effluents, for example mining discharges loaded with sulphates, phosphates or carbonates; effluents from the metallurgical industry; effluents from the nuclear industry; reverse-osmosis concentrates; scaling solutions; effluents from the paper industry; saline aquifers.

The method according to the invention may use solutions with high concentrations of impurities, in particular of NaCl, for example with concentrations beyond 150 g/L.

The purification method according to the invention, described below, allows in particular solutions with a very high concentration of impurities, in particular of NaCl, for example with concentrations beyond 150 g/L, to be treated.

The liquid may thus be chosen from aqueous solutions of NaCl having a concentration of NaCl greater than 150 g/L.

The method for forming, crystallising clathrates hydrates according to the invention may be integrated into any method comprising at least one step for forming, crystallising clathrates hydrates. The method into which this step for forming, crystallising clathrates hydrates according to the invention is integrated has all the advantages inherently linked to the method for crystallising clathrates hydrates according to the invention.

It can be said that, in the method according to the invention, as soon as the host molecule is adsorbed onto the support, the latter is equivalent to a phase change material, it acts in an equivalent manner and may thus be used in any method in which phase change materials may be implemented, and during which compensation for the thermal effects may in particular occur.

The method comprising at least one step of formation, crystallisation of clathrates hydrates according to the invention may be for example a method for purifying water or any other method comprising a step of crystallisation of a hydrate phase, and during which compensation for the thermal effects may occur.

The invention further relates to a method for purifying a liquid comprising water and at least one impurity, wherein the following successive steps are carried out:

a1) clathrates hydrates of the host molecule are formed in the liquid by the method described above;

b1) the clathrates hydrates and the solid support are separated from the liquid;

c1) the separated clathrates hydrates are dissociated in order to obtain, on the one hand, pure water and, on the other hand, the host molecule once again adsorbed onto the solid support.

In addition to the advantageous effects due to the fact that step a1) is carried out by the method according to the invention, the purification method according to the invention also has other advantages substantially due to the implementation of a solid support that adsorbs the host molecules.

In the purification method according to the invention, the host molecule such as cyclopentane, is never free, throughout this method, it is always captive, since it is either integrated into the hydrate or adsorbed onto the support for example made of activated carbon.

Step b1) is generally carried out by filtration.

During step b1), the solid support for example made of activated carbon acts as a separation medium (filtration bed), and thus ensures better and faster separation, filtration.

In general, during step c1), the clathrates hydrates are dissociated by melting them and step c1) is therefore a step of melting the clathrates hydrates.

During step c1), as soon as the hydrates melt, the host molecule, such as cyclopentane is totally completely re-adsorbed, once again adsorbed onto the solid support.

Thus, thanks to the solid support, for example made of activated carbon, the melting endotherm of the hydrates (between $t_3$ and $t_4$ on the curve drawn with a solid line of FIG. 3) is compensated for by the exotherm of the adsorption of the host molecule, such as cyclopentane onto the support (see the curve drawn with a dotted line on FIG. 3).

The energy consumption is here-also greatly reduced and it is possible to eliminate the heat pump.

In the purification method according to the invention that implements a solid support, water of high purity is obtained, free in particular of any host molecule, and in any case having a much higher purity than water obtained by a purification method of the prior art that does not implement a solid support.

For example, with a method for purifying water of the prior art using cyclopentane as the host molecule that does not implement a solid support and in particular that does not implement activated carbon, the water still contains 100 ppm of cyclopentane, whereas with the purification method according to the invention that implements activated carbon, the cyclopentane cannot be detected and its concentration is below the detection limits.

Advantageously, in the method for purifying a liquid according to the invention, the host molecule adsorbed onto the solid support obtained after step c1) is sent back, recycled, to step a1).

Two embodiments are possible for carrying out this recycling of the host molecule adsorbed onto the solid support.

According to a first embodiment, the host molecule adsorbed onto the solid support may be recycled in the form of an aqueous suspension, comprising a minimal amount of water, that is to say, the amount of water that is just necessary to allow hydraulic transportation, manipulation. This aqueous suspension may be conveyed to step a1) by any suitable hydraulic transportation means for example using pumps, pipes etc.

According to a second embodiment, the host molecule adsorbed onto the solid support may be recycled in solid form, for example in the form of a filter cake. This solid may be conveyed to step a1) by any suitable means for transporting a solid, for example on conveyor belts etc.

Because of this recycling, the consumption of host molecule is considerably reduced, which also reduces the overall cost of the purification method according to the invention.

Other advantages of the invention will be readily apparent upon reading the detailed description that follows, given for illustrative purposes and in a non-limiting way in relation to the appended drawings.

The origin of the times is at $t_2$.

Figure 1:
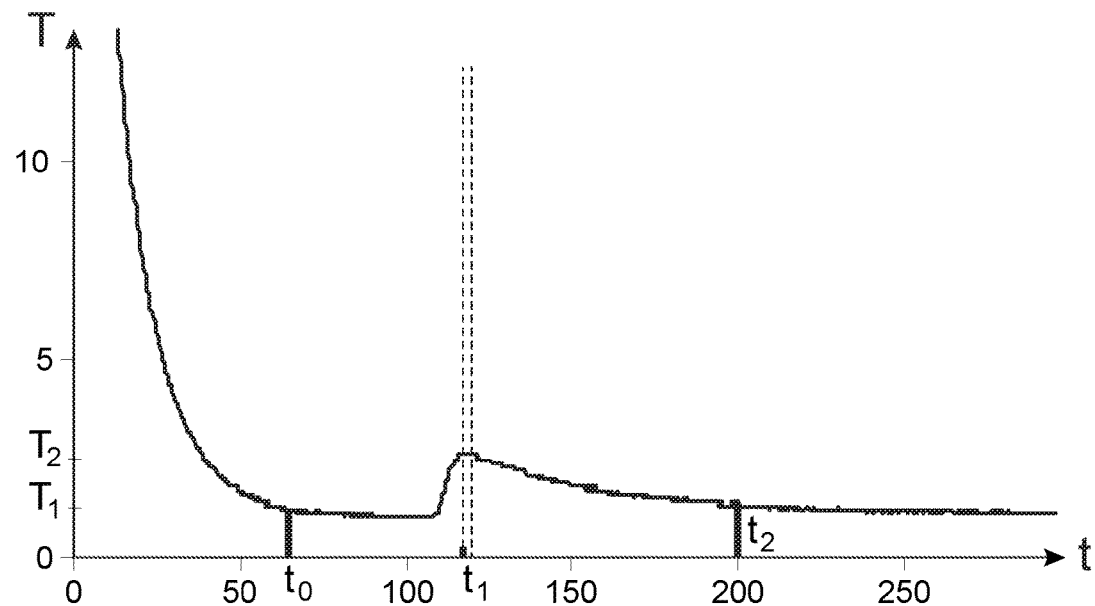
FIG. 1 is a graph that gives the Temperature of the liquid (T in ° C.) as a function of time (t in minutes) during the cooling of the liquid and the crystallisation of the clathrates hydrates in a method for crystallising hydrates of the prior art that does not implement a solid support, for example made of activated carbon.
Figure 2:
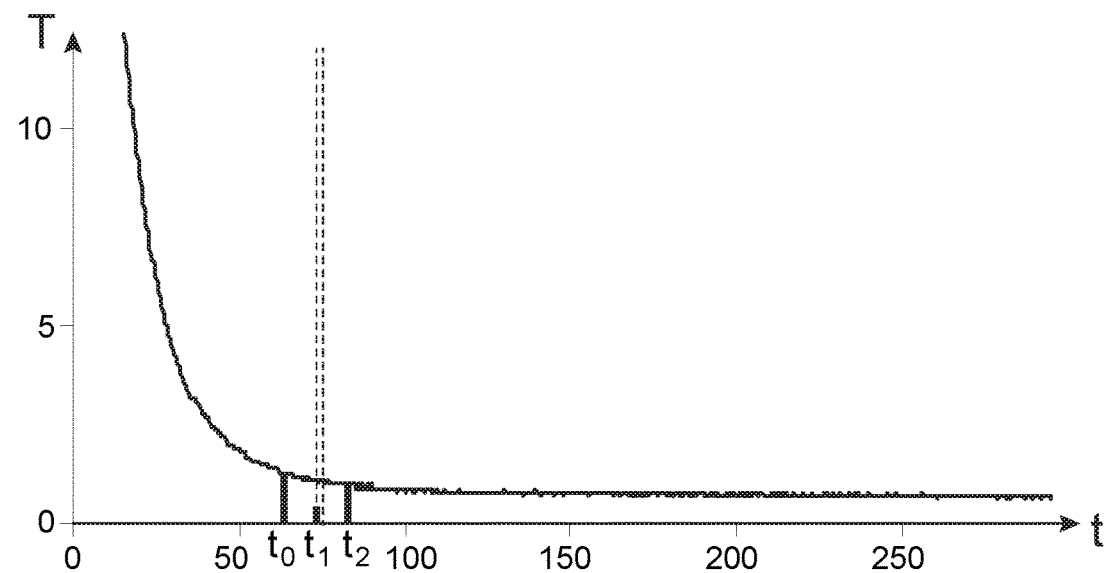
FIG. 2 is a graph that gives the Temperature of the liquid (T in ° C.) as a function of time (t in minutes) during the cooling of the liquid and the crystallisation of the clathrates hydrates in a method for crystallising hydrates according to the invention that implements a solid support, for example made of activated carbon.
Figure 3:
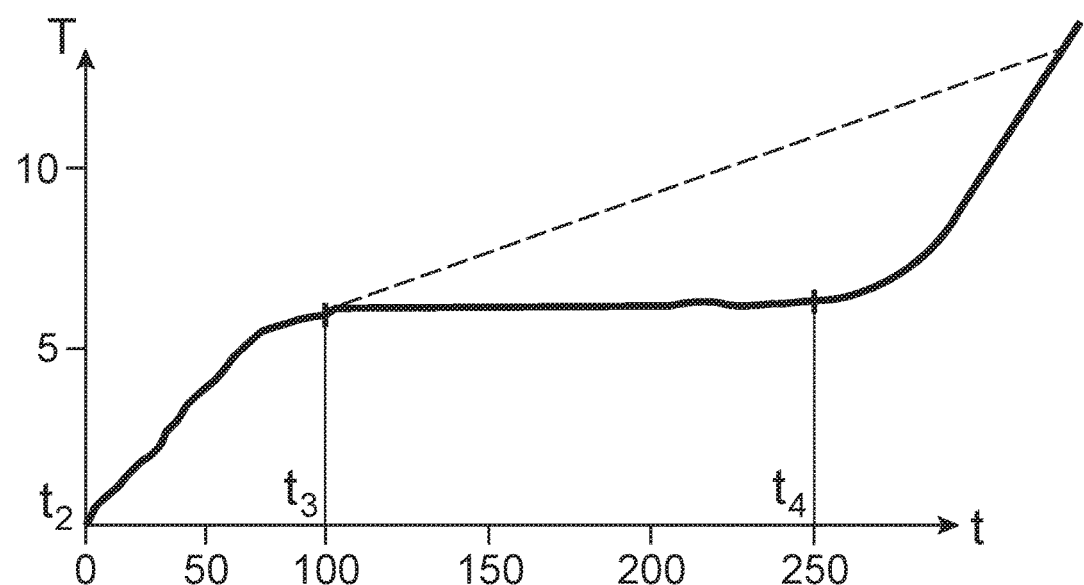
FIG. 3 is a graph that gives the Temperature of the liquid (T in ° C.) as a function of time (t in minutes) during the step of melting the clathrates hydrates, in a purification or transportation method of the prior art that does not implement a solid support for example made of activated carbon (curve drawn with a solid line), or in a purification method according to the invention that implements a solid support for example made of activated carbon (curve drawn with a dotted line).
Figure 4:
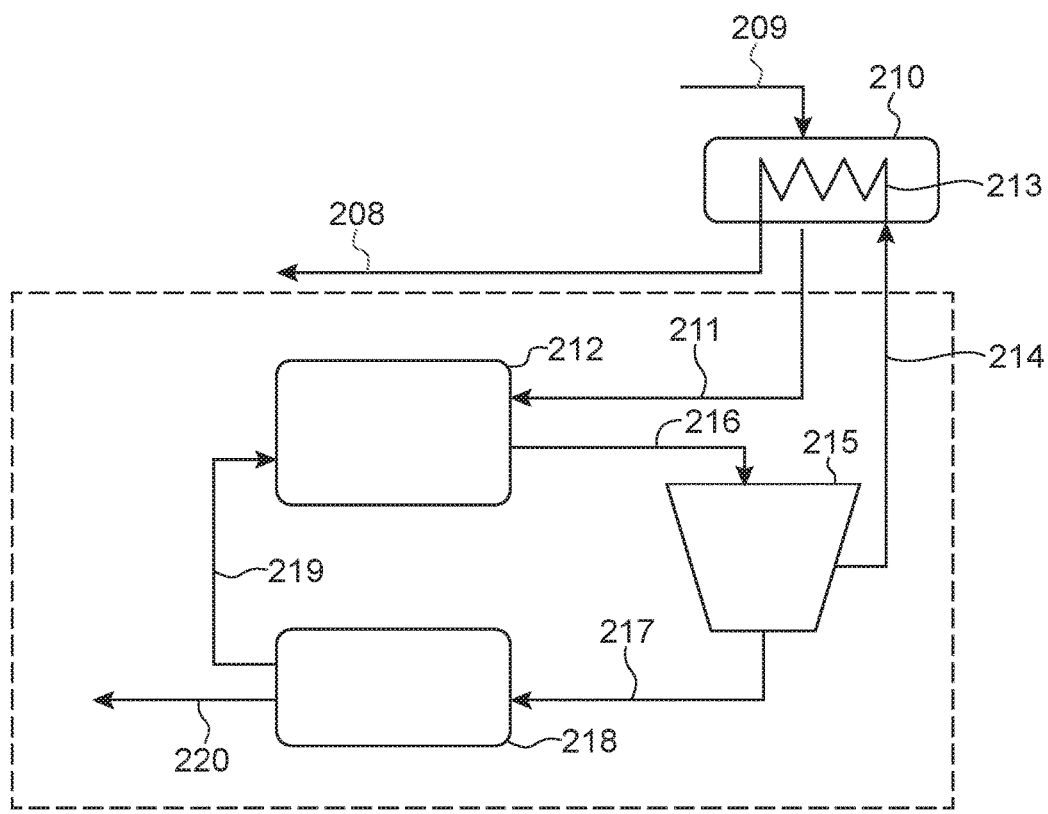

FIG. 4 is a schematic view that illustrates a facility for implementing the purification method according to the invention that uses clathrates hydrates crystallised by the method for crystallising clathrates according to the invention, as well as the implementation of the purification method according to the invention in this facility.

DETAILED DESCRIPTION OF SPECIFIC EMBODIMENTS

FIG. 4 is a schematic view that illustrates an embodiment of a facility for implementing the purification method according to the invention, carried out continuously, in order to purify a water rich in impurities, such as an aqueous solution rich in impurities, for example a saline aqueous solution predominantly containing NaCl and other impurities.

It is obvious that this saline aqueous solution is only given as an example, and that the method illustrated in FIG. 4 can be used to purify any water rich in impurities.

The solution to be treated is conveyed via a pipe 209 into a cooling device 210. This solution to be treated, purified, is then sent via a pipe 211, into a reactor for crystallising and growing the clathrates hydrates 212 into which host molecules, for example cyclopentane, adsorbed onto a solid support, for example made of activated carbon, have been introduced.

The cooling device 210 comprises a heat exchanger 213 in which an heat exchange takes place between the solution to be treated and the solution concentrated in impurities that circulates in a pipe 214 and then in a pipe 208.

The suitable heat exchangers are known to the man skilled in the art and will not therefore be described in more detail.

The water contained in the cooled solution to be purified conveyed by pipe 211, and the host molecules adsorbed onto a solid support which can be found in the reactor 212 form clathrates hydrates that grow in this reactor 212 for crystallising and growing the clathrates hydrates.

Cyclopentane can preferably be used as the host molecule, but other host molecules may also be used, for example gaseous molecules such as methane, ethane, butane, propane, hydrogen sulphide, carbon dioxide, or their mixtures.

In general, the host molecule is chosen in such a way as to not affect the rest of the method. Consequently, the host molecule may be chosen according to economic criteria or others.

It is particularly advantageous to use cyclopentane as the host molecule, since it allows the clathrates hydrates to be formed in the reactor 212 for crystallising the clathrates at atmospheric pressure, namely at a pressure of 1 bar and at a temperature generally between −20° C. and 6° C.

The solid support is preferably made of activated carbon.

It should be noted that the temperature at which the clathrates hydrates are formed in the reactor 212 is dependent on the concentration of impurities in the reactor 212. Indeed, in general, the concentration of impurities lowers the temperature of crystallisation of the clathrates.

Since water is used to form the clathrates hydrates in the reactor 212, a suspension of clathrates hydrates and of the solid support in a solution concentrated in impurities is therefore obtained in the reactor 212.

The suspension of clathrates hydrates and of solid support in a solution concentrated in impurities formed in the reactor 212, is withdrawn in the reactor 212, and is sent to a separator 215 via a pipe 216.

In the separator, the clathrates hydrates and the solid support are separated from the solution concentrated in impurities by using a liquid/solid separation technique.

The liquid/solid separation technique used to separate the clathrates hydrates and the solid support from the solution concentrated in impurities is dependent on the type of clathrates hydrates but also on other factors. The man skilled in the art can easily choose the suitable technique as a function of the properties of the clathrates hydrates such as for example their particle size distribution.

This liquid/solid separation technique may be chosen for example from all the conventional techniques for liquid/solid separation, such as filtration for example with a filter press, centrifugation.

The solution concentrated in impurities separated in the separator 215 and which thus no longer contains clathrates hydrates or solid support is withdrawn, from the separator 215, via the pipe 214 that feeds the heat exchanger 213 in order to cool the initial solution to be purified 209 in the cooling device 210.

The solution concentrated in impurities, after having fed the heat exchanger 213 in order to cool the initial solution to be purified 209 in the cooling device 210, exits this cooling device 210 via the pipe 208.

Two alternatives are possible for the treatment of this solution concentrated in impurities that circulates in the pipe 208:

According to a first alternative, the concentrated solution is introduced in its entirety into the stream of solution to be treated that circulates in the pipe 209. In this case, the impurities will be concentrated up to the eutectic concentration. In order to make the hydrates crystallise in the reactor 212, a temperature T lower than the temperature of the eutectic needs to be set. The impurities, in particular the salts, will thus be withdrawn in solid form via a drain (not shown) located at the base of the reactor 212.

According to a second alternative, the concentrated solution is partially discharged in order to form the liquid drain-off, purge, in the form of a concentrate, and the rest of the concentrated solution, which is therefore not discharged, is introduced into the current of solution to be treated that circulates in the pipe 209 (thus, there is no longer discharge in solid form via a drain, purge, located at the base of the reactor 212).

The lower the proportion of discharge, the more concentrated the concentrate, but the more concentrated the crystallisation solution as well, and thus the lower the temperature of crystallisation of the hydrates. The eutectic forms the lower limit of this alternative (no more liquid discharge).

The clathrates hydrates and the solid support separated in the separator 215 are withdrawn in the separator 215 via a pipe 217 and conveyed into a reactor for dissociation of the clathrates hydrates 218, in which the clathrates hydrates are separated into host molecules and purified water.

Any known dissociation technique can be used. In general, the dissociation of the crystallised crystals of hydrate into water and host molecules is carried out by an increase in temperature that leads to their melting. In other words, the crystallised crystals of hydrate are melted; the reactor 218 is then called a melter.

Then, the purified water, on the one hand, and the host molecules and solid substrate on the other hand, the host molecules being adsorbed onto the solid support, are separated by a liquid/solid separation technique such as decantation or filtration.

Thus, in the case in which the host molecule is a liquid immiscible with water, the dissociation by melting of the clathrates hydrates in the reactor 218 forms a suspension that is introduced into a filter (not shown) in order to separate the purified water from the host molecule adsorbed onto the solid support and the solid support.

The host molecule adsorbed onto the solid support is recycled with the solid support from the reactor 218 into the reactor 212 via a pipe 219.

In the facility according to the invention, the host molecules and the solid support are thus recycled and used again which increases the profitability of the facility.

The purified water is discharged from the reactor 218 or from the filter via a pipe 220 and can be used.

It is noted that the facility for implementing the purification method according to the invention, shown in FIG. 4, does not comprise a heat exchanger such as a heat pump that would operate between the reactor for crystallising and growing clathrates hydrates 212 and the reactor for dissociation of the clathrates hydrates 218.

The absence of such a heat exchanger such as a heat pump constitutes one of the advantages of the method according to the invention.

To optimise the method, however, it would be of interest to place a heat exchanger between the reactor for dissociation of the clathrates hydrates such as a melter 218 and the stream of solution to be treated or entering flow that circulates in the pipe 209.

The heat of the entering flow would then help to melt the hydrates, while the cold from the reactor 218 such as a melter would allow the stream of solution to be treated or entering flow to already be cooled before entering the cooling device 210.

What is claimed is:

1. A method for forming or crystallizing clathrates hydrates of a host molecule in a liquid comprising water, the method comprising the following successive steps:
    cooling the liquid to a temperature less than or equal to the crystallization temperature of the clathrates hydrates;
    contacting the cooled liquid with host molecules capable of forming clathrates hydrates, wherein the host molecules capable of forming clathrates hydrates are adsorbed onto a solid support having a high specific surface area and made of an apolar and hydrophobic material; whereby the host molecules are desorbed from the solid support having a high specific surface area and made of an apolar and hydrophobic material and react with the water of the liquid to give a liquid containing clathrates hydrates and the solid support.

2. The method according to claim 1, wherein the solid support has a specific surface area from 100 to 2000 $m^2/g$.

3. The method according to claim 1 that is carried out continuously.

4. The method according to claim 1, wherein the solid support is in the form of discrete particles.

5. The method according to claim 1, wherein the solid support is in the form of a woven fabric of fibres or a nonwoven fabric of fibres.

6. The method according to claim 1, wherein the solid support is made of a material chosen from materials capable of adsorbing the host molecule with an adsorption energy lower than the energy of crystallisation of the clathrates hydrates.

7. The method according to claim 1, wherein the host molecule is chosen from linear or branched hydrocarbons comprising from 1 to 6 carbon atoms, halogenated hydrocarbons, cyclic hydrocarbons comprising 3 to 10 carbon atoms, $CO_2$, oxygen, nitrogen, $H_2S$, noble gases, tetrahydrofuran, ethylene oxide, sulphur hexafluoride, tetra-n-butylammonium bromide (TBAB), and $N_2O$.

8. The method according to claim 1, wherein the host molecule is immiscible with water, or insoluble in water.

9. The method according to claim 1, wherein the host molecule is chosen from host molecules that allow crystallising of clathrates hydrates at atmospheric pressure and at temperatures greater than that of the crystallisation of ice.

10. The method according to claim 1, wherein the host molecule is chosen from the molecules that form a clathrate hydrate having a specific gravity lower than the specific gravity of the aqueous solution.

11. The method according to claim 1, wherein the host molecule is cyclopentane or cyclohexane.

12. The method according to claim 1, wherein the liquid comprising water comprises water and at least one impurity.

13. The method according to claim 12, wherein the liquid comprising water is a solution.

14. The method according to claim 12, wherein the impurity is any element, molecule, or ion different than the chemical species constituting pure water, namely $H_2O$, $OH^-$, and $H^+$.

15. The method according to claim 14, wherein the impurity is chosen from mineral salts, organic salts, organic compounds soluble in water, and their mixtures.

16. The method according to claim 12, wherein the liquid comprising water is chosen from seawater, brackish waters, public landfill leachates, waters from oil production, waters from extraction of shale gas by the hydraulic fracturing technique, liquids from the agri-food industry, liquids from the pharmaceutical industry, liquids from the chemical industry, mining effluents, effluents from the metallurgical industry, effluents from the nuclear industry, reverse-osmosis concentrates, scaling solutions, effluents from the paper industry, and saline aquifers.

17. The method according to claim 12, wherein the liquid comprising water has a concentration of impurity or impurities from 1 mg/L to 500 g/L.

18. The method according to claim 12, wherein the liquid is chosen from solutions of NaCl having a concentration of NaCl greater than 150 g/L.

19. A method for purifying a liquid comprising water and at least one impurity, the method comprising the following successive steps:
　a1) clathrates hydrates of the host molecule are formed in the liquid by the method according to claim 12;
　b1) the clathrates hydrates and the solid support are separated from the liquid;
　c1) the separated clathrates hydrates are dissociated in order to obtain, on the one hand, pure water and, on the other hand, the host molecule once again adsorbed onto the solid support.

20. The method according to claim 19, wherein during step c1), the clathrates hydrates are dissociated by melting them.

21. The method according to claim 20, wherein the host molecule adsorbed onto the solid support and obtained after step c1) is sent back to step a1).

22. The method according to claim 1, wherein the solid support comprises beads made of activated carbon.

23. The method according to claim 22, wherein the beads have a diameter from 0.2 to 15 mm.

24. The method according to claim 4, wherein the discrete particles are beads, fibres, or tubes.

25. The method according to claim 24, wherein the beads have a diameter from 0.2 to 15 mm.

26. The method according to claim 6, wherein the solid support is made of a material chosen from activated carbon, oxides of metals, oxides of metalloids, zeolite, and organic polymers.

27. The method according to claim 26, wherein the oxides of metalloid is silica.

28. The method according to claim 27, wherein the silica is mesoporous silica.

29. The method according to claim 10, wherein the specific gravity of the aqueous solution is lower than 1.3.

30. The method according to claim 29, wherein the specific gravity of the aqueous solution is lower than 1.0.

31. The method according to claim 17, wherein the concentration of impurity or impurities is from 100 mg/L to 250 g/L.

\* \* \* \* \*